(12) United States Patent
Horsfield

(10) Patent No.: US 8,394,707 B2
(45) Date of Patent: Mar. 12, 2013

(54) METHOD OF SPLITTING OF BRITTLE MATERIALS WITH TRENCHING TECHNOLOGY

(75) Inventor: Nicholas Horsfield, Faak am See (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 12/539,494

(22) Filed: Aug. 11, 2009

(65) Prior Publication Data

US 2009/0298262 A1 Dec. 3, 2009

Related U.S. Application Data

(62) Division of application No. 11/528,826, filed on Sep. 28, 2006, now abandoned.

(30) Foreign Application Priority Data

Sep. 28, 2005 (DE) .......................... 10 2005 046 479

(51) Int. Cl.
*H01L 21/46* (2006.01)
*H01L 21/78* (2006.01)
*H01L 21/326* (2006.01)
*H01L 21/76* (2006.01)
*H01L 21/302* (2006.01)

(52) U.S. Cl. ......... 438/460; 438/689; 438/424; 438/706

(58) Field of Classification Search .................. 438/460, 438/424, 723, 743, 689, 706, 708, 709, 734, 438/735, 745, 494, 704
See application file for complete search history.

(56) References Cited

U.S. PATENT DOCUMENTS

| 4,179,794 | A | 12/1979 | Kosugi et al. |
| 6,992,026 | B2 * | 1/2006 | Fukuyo et al. ................ 438/797 |
| 7,422,962 | B2 | 9/2008 | Chen et al. |
| 2003/0145624 | A1 * | 8/2003 | Luettgens et al. ............. 65/17.1 |
| 2004/0251290 | A1 | 12/2004 | Kondratenko |
| 2005/0070092 | A1 * | 3/2005 | Kirby ........................... 438/637 |

FOREIGN PATENT DOCUMENTS

| DE | 3731312 A1 | 3/1989 |
| DE | 692 04 828 T2 | 5/1996 |
| EP | 0 633 867 B1 | 8/1996 |
| WO | 9620062 | 7/1996 |

* cited by examiner

*Primary Examiner* — Chuong A. Luu
(74) *Attorney, Agent, or Firm* — Dicke, Billig & Czaja, PLLC

(57) ABSTRACT

One aspect of the invention relates to a method for splitting an object made of brittle material into at least two pieces. The object has a first flat surface and a second flat surface opposite to each other. The method includes etching at least one trench in at least one of the surfaces so as to form at least one line on the surface. The method also includes splitting the object into separate pieces along the line.

23 Claims, 4 Drawing Sheets

METHOD OF SPLITTING OF BRITTLE MATERIALS WITH TRENCHING TECHNOLOGY

CROSS-REFERENCE TO RELATED APPLICATIONS

This application is a divisional of U.S. patent application Ser. No. 11/528,826, entitled "METHOD OF SPLITTING OF BRITTLE MATERIALS WITH TRENCHING TECHNOLOGY," having a filing date of Sep. 28, 2006, and claims priority to German Patent Application No. DE 10 2005 046 479.3, filed on Sep. 28, 2005, all of which are incorporated herein by reference.

BACKGROUND

One aspect of the present invention relates to methods for splitting objects made of brittle materials and, in particular, methods for splitting semiconductor wafers made of brittle materials.

Known in the art are methods for cutting and splitting objects made of brittle materials such as glass, sapphire, quartz, silicon, germanium, ceramic, and many others. An important industrial application of brittle material cutting is semiconductor manufacturing where one semiconductor wafer is diced into many separate, smaller pieces.

Brittle material cutting and splitting methods range from conventional sawing to splitting with mechanical force or with a scribing/abrasion tool, to thermal splitting with or without a thermal shock process, laser ablation, or a combination of any of the above. US 2004/0251290 A1, provides, in the introduction section thereof, a summary of some of the well-known conventional brittle material splitting methods.

Among the many limitations of the conventional methods are inefficiency and low quality of edges obtained with these methods. To improve these aspects, EP 0 633 867 B1 discloses a method for splitting bodies of non-metallic brittle material, such as glass, by scoring a certain point of the material to a certain depth followed by splitting it with some splitting method. The scoring, however, inevitably causes an "initial damage" to the material. Although claimed to provide for increasing splitting speed and improving edge quality, this method may nevertheless require an "initial damage" to be made to the object of brittle material at the start of each splitting which may cause intolerable problems. For example, in certain applications, such as semiconductor wafer dicing, many such "initial damages" are required due to the requirement of cutting the wafer in both X and Y directions. This is very time consuming and for small dies not practicable.

In addition due to the very "initial damage," the quality of the edge(s) of the separate wafer pieces or devices finally produced would suffer; besides, low-quality edge(s) would in turn degrade the pieces or devices in terms of mechanical properties, such as the robustness and electrical properties, such as the electrical leakage current of the device.

Thus, a method for splitting objects of brittle materials that is fast, produces high quality edges for the end pieces, and causes little or no mechanical and electrical property loss to the end pieces would be a useful improvement.

SUMMARY

One aspect of the invention provides a method for splitting an object made of brittle material into at least two pieces. The object has a first flat surface and a second flat surface opposite to each other. The method includes etching at least one trench in at least one of the surfaces so as to form at least one line on the surface. The method also includes splitting the object into separate pieces along the line.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
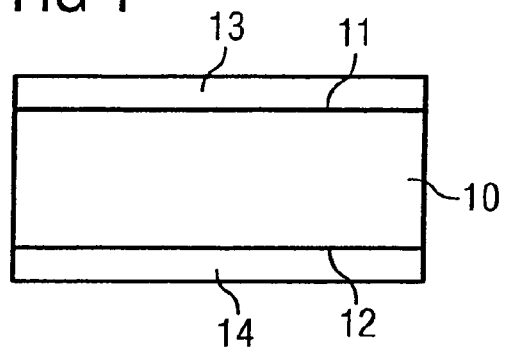
FIG. 1 is a cross sectional view of an example object made of brittle material.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One embodiment of method is applicable to any object made of either a single brittle material or a combination of different materials. The object is in one case flat and has two flat surfaces opposite to each other.

The method one case is applicable to processed semiconductor wafer. This is typically made from a substrate of brittle material with various additional layers such as Oxide, metal, silicone glass etc. The pieces obtained by splitting a processed semiconductor wafer usually are referred to as "devices" or "chips".

One aspect of the method is to combine trench etching with any of brittle material cutting or splitting methods. Specifically, the method firstly etches a trench or a plurality of trenches in at least one of the two opposite flat surfaces of the object, the trench or trenches thus defining a line or a plurality of lines on the surface(s) etched; then the method splits the object into at least two pieces along the defined line(s) with any of brittle material splitting methods. These methods include, but are not limited to, splitting with mechanical force, scribing/abrasion methods, thermal splitting with or without a thermal shock process, laser ablation, etcetera. The edges of the separated pieces correspond to the defined line(s) along which the splitting takes place.

In one embodiment of the present invention, trench etching plays a role. Etching removes a part of the brittle material along the line(s) created by the etched trench(es) and therefore decreases the wafer strength along the line(s). Compared with methods for splitting the object without trench etching prior to the final splitting, this weakening enables the final splitting to be performed in many directions including crossing a previously split line and at a higher speed, with better edge quality and under a better control.

So etching trenches in the surface(s) of an object of brittle material prior to splitting the object provides one aspect of the present invention with advantages over the prior art methods.

Firstly, one aspect of the invention saves a great deal of time. In splitting the object into many pieces, the prior art method needs to make an initial defect at the start of each cut. In embodiments the present invention, a plurality of trenches in the same or in different directions can be formed at the same time. Thus, in examples such as semiconductor wafer dicing where a wafer usually needs to be diced into small pieces in both X and Y directions, the "initial damage" must be precisely made, not only at the wafer edge in the X direction, but also at each chip in the Y direction. This is extremely time consuming to the extent that for small dies it is not possible. So, embodiments of the method of the present invention are more efficient than the prior art method.

Secondly, trench etching weakens the substrate material in the area where splitting is to be performed. This reduces the tendency for stress inherent in the substrate to change the direction of splitting, for example in the wafer edge regions, and it also enables splitting the object in directions other than the crystal alignment, which provides more splitting options. For example the outer edge or a portion of the wafer may be removed. This has important applications for some semiconductor manufacturing processes.

Thirdly, embodiments of the present invention improve the quality of the edge or edges produced. Etching techniques generally produce an edge that is free of stress or defects and has good mechanical and electrical properties. Etching applies no direct force to the material so no crystal dislocations, crystal defects etc or other mechanical defects such as microcracks are formed. In addition the etching temperature is also relatively cool and high temperature damage is avoided. For example in the case of silicone plasma etching is typically 400° C. which is well below those high temperature processes (above 800° C.) that can cause slip, recrystallisation and reformation of the substrate, as well as damage to metal layers and alteration of doping profiles. Such defects cause major problems. In the case of glass or sapphire the mechanical strength and robustness is reduced. In the case of semiconductors not only is the mechanical strength compromised but the electrical properties particularly leakage current may be greatly increased. As such the resultant edge produced from edge trenching and certain splitting methods is free of defects and mechanically and electrically superior to the edge produced by prior art methods particularly where initial damage or high temperatures are used.

Fourthly, the improved electrical performance resulting from embodiments of the present invention leads to a further advantage for electrical devices: Edge termination structures are typically used in devices to isolate the poor quality defective edge from the virtually defect free active area. If the edge is of superior quality the size of the edge termination structures may be reduced or even eliminated. This may greatly reduce the device area required and hence significantly increase the number of devices obtained from a wafer.

Fifth, as a result of the improved mechanical edge quality resulting from embodiments of the method according to the present invention the robustness is improved to a point that breakage either during splitting or subsequently in later processing is also reduced leading to an improved yield.

Sixth, the trenches formed in the surface(s) of the object where splitting is to take place, also provide a useful visual alignment aid for the actual splitting. As a result, the splitting can be done easier, quicker, and under a better control, all contributing to a further improvement in speed and edge quality at the end of the splitting.

Seventh, embodiments of the present invention are much more useful for splitting thin materials than the prior art methods. Any "initial damage" or mechanically stress inducing process such as high temperature may result in an uncontrolled fracturing and breakage of the material. For example for semiconductor devices "Thin wafers" typically below 220 um are processed and it becomes increasingly difficult to cut such wafers, particularly below thicknesses of 100 um. Embodiments of the present invention can, as a result of the process properties already described, enable the cutting of such thin materials. Unlike the prior art method where the "initial damage" or high temperatures may break the thin wafers, trench etching in semiconductor wafers is a developed technology that can be well controlled and adjusted so as not to cause any breakage to thin wafers.

Finally, certain brittle splitting methods are not capable of additionally splitting the metallization layers found on the front or backside of the material. The trench etching of embodiments of the present invention can cut through these layers as an inherent part of the process, thus providing a method of enabling certain splitting methods which are not otherwise possible. For example in power semiconductors the backside is frequently used as a contact for the device and relatively large currents may flow. This requires a stack of different metals of varying thicknesses and the cutting operation must separate these without undercutting or producing mechanical or chemical stress that may result in peeling of this metallization or other such problems. The present invention allows both brittle and non brittle materials to be cut as an inherent feature of the combined processes.

Summarizing the above, combining the trench etching technology with the brittle material splitting methods, the brittle material splitting method of the present invention provides an efficient process with excellent performance that facilitates many splitting options, produces high-quality edges with good mechanical and electrical properties, and is free from the defects typically obtained with mechanical sawing or prior art techniques requiring the "initial damage."

FIG. 1 is a cross sectional view of an example object made of brittle material. The object 10 may be made of a single brittle material or a combination of different materials such as a processed Semiconductor wafer, composed of a brittle substrate and a number of other layers such as oxide, metal, silicone glass, silicone nitride etc. The object is in one case flat and has two flat surfaces 11 and 12 opposite to each other. A specific example of such an object is a processed semiconductor wafer made using silicon, germanium, or other material known in the art. The wafer has two surfaces typically called the front-side and the back-side, which correspond to the upper surface 11 and the lower surface 12 in FIG. 1, respectively. Typically, these two surfaces are opposite to each other, with a distance of typically less then 250 um (although distances up to 500 um are also common.)

A first layer 14 may be formed below the lower surface 12, or back-side, of the wafer. Furthermore, a second layer 13 may be formed above the upper surface 11, or front-side, of the wafer in addition to any that may form part of the processed wafer object 10.

Each of layers 13, 14 may be a single metallization layer or passivation layer, or may be a composite layer including at least one of a metallization and a passivation layer or isolation layer. Such sandwich structure of different layers may serve as a wiring structure for semiconductor devices integrated in the chips/dies forming the wafer.

Figure 2:
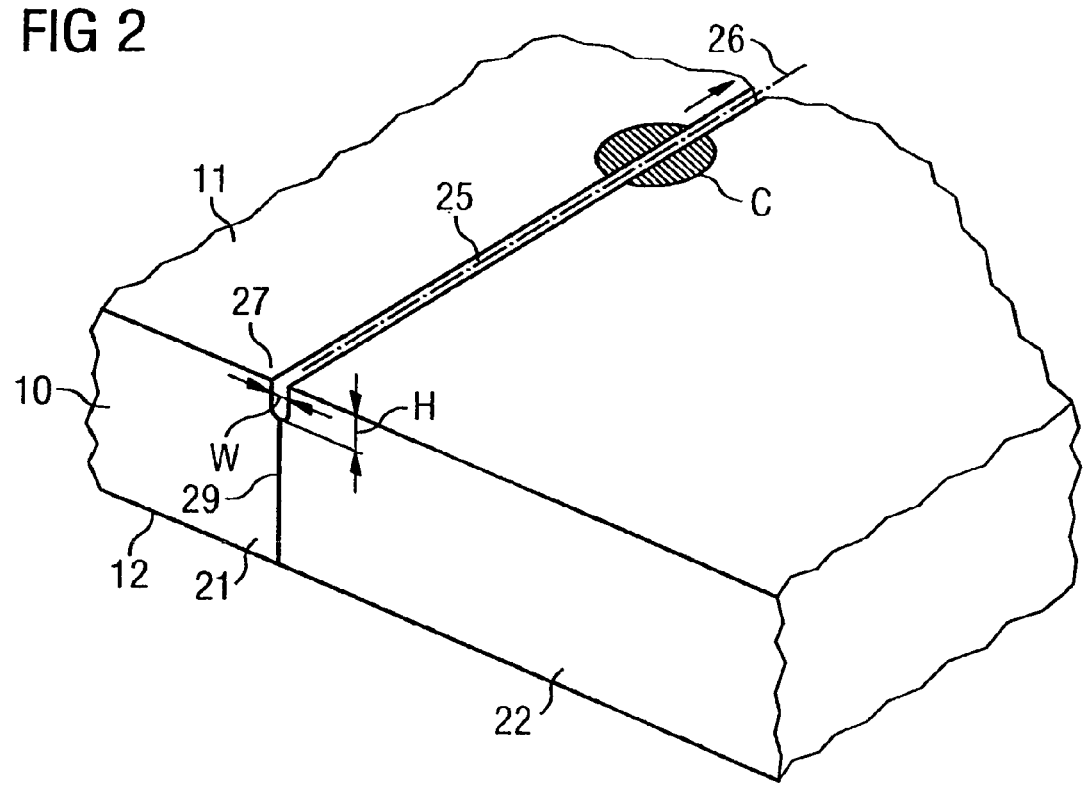
FIG. 2 is a perspective view of a part of the object being split using a first embodiment of the method of the present invention.

FIG. 2 is a perspective view illustrating a part of the object of brittle material being split using a first embodiment of the method of the present invention. This first embodiment provides a method for splitting the object into two separate pieces by firstly etching a trench in a surface of the object and then applying a splitting method to the object to complete the splitting.

Specifically in this embodiment, in a first step, a trench 25 is etched into one of the two surfaces, here the upper surface 11, of the object 10, thus defining a line 26 on the surface 11. Although not an absolute must, in one case the line 26 originates from an end 27 of the surface and extends to another end (not illustrated) of the surface. The depth of the resultant trench is marked with H and the width thereof is marked with W.

Any known etching technique may be used to form the trench. For example, in the case of semiconductor wafer dicing, a photolithographic process may be used to define the location of the trench to be formed. For instance, a mask layer may be formed over the wafer to define a line opening over the wafer. The defined location is then etched using a selective etchant. Any etchant known in the art may be used, for example, a dry etchant such as one of the anisotropic dry plasma type, a wet etchant such as a wet chemical, or else. A deep trenching plasma technique may be used in one case, as it produces a deep trench which provides certain benefits as to be discussed below. For the same reasons, a longer etching time may be used rather than to a shorter one. The trench profile is typically U shaped, as illustrated in the figure, but others such as V or bottle shaped are also possible, depending on the different etching techniques used and etching conditions applied. It should be noted that the dimension and profile of the resulting trench are not a big concern, because it is sufficient as long as the etching causes a weakening of the brittle material to the extent where the final splitting using conventional brittle material splitting methods is possible. Nevertheless, a deep and narrow trench, that is, a high depth-to-width ratio (H:W), is used in one case because it results in a high decrease in the brittle material strength while minimizing the width required for the final splitting. That is, a high depth-to-width ratio of the trenches enables an efficient splitting and achieves good edge quality at the end of the splitting—for semiconductor wafers, good edge quality also means good mechanical and electrical properties. A typical high depth-to-width ratio is 5:1 or above. This ratio corresponds to a trench depth of 5 µm and a trench width of 1 µm in a semiconductor wafer of a standard thickness, such as between 50 µm to 200 µm, 100 µm for example.

After the trench 25 is etched, the object 10 is split into two pieces 21 and 22 along the line 26 by using any of the brittle material splitting methods known in the art, such as, splitting with mechanical force, scribing/abrasion methods, thermal splitting with or without a thermal shock process, laser ablation, etc. For instance, if a thermal splitting method is used, the area C of the object that is heated traverses along the trench 25 thus forming a crack 29 in the body of the object. The crack originates from the bottom of the trench and extends towards the other surface, here 12, of the object. Once the crack 29 completely goes through the object, the object is split into two pieces.

Figure 3:
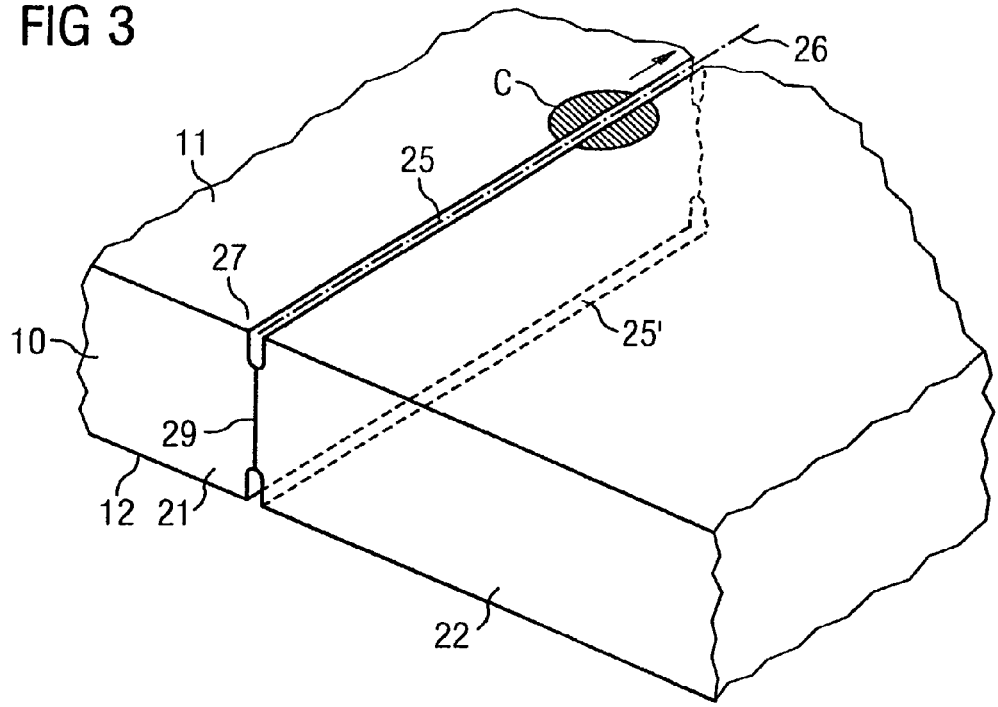
FIG. 3 is a perspective view of a part of the object being split using a second embodiment of the method of the present invention.

FIG. 3 is a perspective view illustrating a part of the object of brittle material being split under a second embodiment of the method of the present invention. This second embodiment provides a method for splitting the object into two separate pieces by firstly etching a trench in one surface of the object, then etching another trench in the opposite surface of the object, whereas the second trench is in good alignment with the first trench, and finally applying any of the conventional brittle material splitting methods to the object to complete the splitting.

Specifically in this embodiment, in the beginning, a trench 25 is etched into one of the two surfaces, for example, the upper surface 11, of the object 10, thus defining a line 26 on the surface 11. Then, another trench 25' is etched into the opposite surface 12 of the object 10. Any known etching technique as discussed earlier may be used to form the trenches. However, it is important that the two trenches are well aligned. Finally, the object 10 is split into two pieces 21 and 22 along the line 26 by using any of the brittle material splitting methods known in the art. This final splitting step forms a crack 29 in the body of the object, the crack originating from the bottom of the first trench 25 and extending towards the bottom of the second trench 25'. Of course, extending the crack in the opposite direction is also possible. Once the crack 29 completely goes through the object, the object is split into two pieces.

Figure 4:
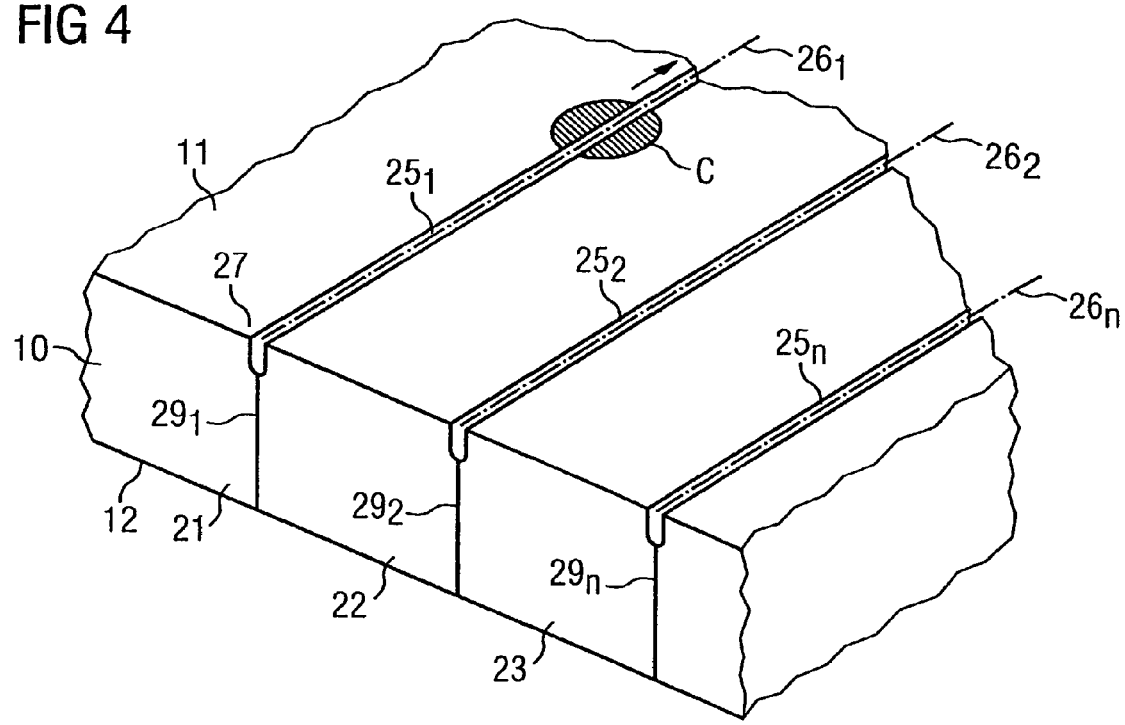
FIG. 4 is a perspective view of a part of the object being split using a third embodiment of the method of the present invention.

FIG. 4 is a perspective view illustrating a part of the object of brittle material being split under a third embodiment of the method of the present invention. This third embodiment provides a method for splitting the object into more than two separate pieces by firstly etching a plurality of parallel trenches in at least one surface of the object thus defining a plurality of lines on the surface, and then applying any of the conventional brittle material splitting methods to the object to complete the splitting.

Specifically in this embodiment, in the beginning, a plurality of trenches $25_1, 25_2, \ldots, 25n$ are etched into at least one of the two surfaces 11 and 12 of the object 10. It is possible that all the trenches are etched into one surface, say 11. It is also possible to etch some of the trenches into one surface while the others into the other surface. These trenches $25_1, 25_2, \ldots, 25n$ may be etched in parallel. Any known etching technique as discussed earlier may be used to form the trenches. These trenches $25_1, 25_2, \ldots, 25_n$ define, correspondingly, a plurality of lines $26_1, 26_2, \ldots, 26_n$ on the surface(s) 11. Each line, although not an absolute must, originates from an end of the surface and extends to another end of the surface. After the trenches are etched, the object is split into more than two pieces, 21, 22, 23, and so on, along the lines $26_1, 26_2, \ldots, 26_n$ by using any of the brittle material splitting methods known in the art. Like previously discussed, the splitting is completed with the formation and extension of cracks, here a plurality of cracks $29_1, 29_2, \ldots, 29_n$ in the body of the object.

Figure 5:
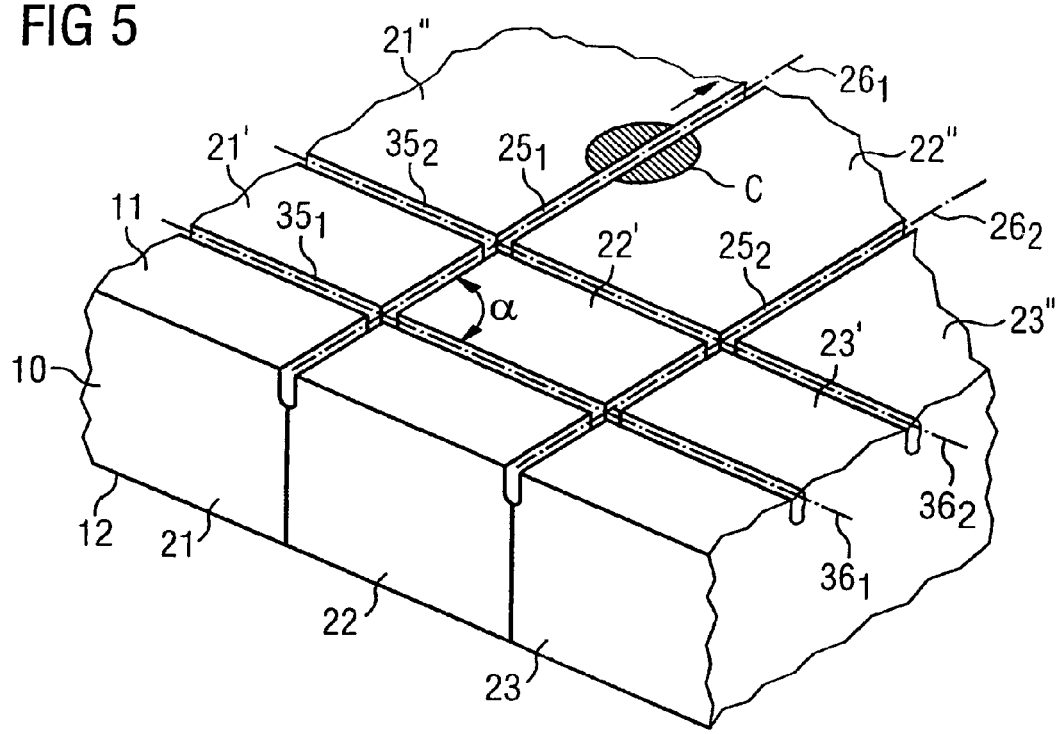
FIG. 5 is a perspective view of a part of the object being split using a fourth embodiment of the method of the present invention.

FIG. 5 is a perspective view illustrating a part of the object of brittle material being split under a fourth embodiment of the method of the present invention. This fourth embodiment provides a method for splitting the object into more than two separate pieces by, to start with, etching a first plurality of trenches $25_1, 25_2, \ldots, 25_n$ (only two are illustrated in the figure) in parallel in one surface, say 11, of the object, thus defining a first plurality of lines $26_1, 26_2, \ldots, 26_n$ in parallel on the surface 11, then etching a second plurality of trenches $35_1, 35_2, \ldots, 35_n$ (only two are illustrated in the figure) in parallel in the same surface thus defining a second plurality of lines $36_1, 36_2, \ldots, 36_n$ in parallel on the surface 11. These two pluralities of lines cross each other with an angle in between, here illustrated as α. α may be any value greater than 0°. For instance, α may be 90°, thus the two plurality of lines are perpendicular to each other. After the trenches are etched, the object is split into more than two pieces, 21, 22, 23, 21', 22', 23', 21', 22", 23", and so on, along the lines $26_1, 26_2, \ldots, 26_n$ and $36_1, 36_2, \ldots, 36_n$ by using any of the brittle material splitting methods known in the art. The details of the etching and final splitting are similar to those discussed in earlier embodiments.

This fourth embodiment of the method is useful in some applications, for example, semiconductor wafer dicing, wherein a wafer is expected to be diced into many smaller pieces in both an X axis and a Y axis. In this situation, the method of the present invention has an advantage in that it can define all the cutting lines in one single step. For instance, a mask layer may be formed over the wafer to define a grid over the wafer indicating the locations of the many trenches to be formed; the defined locations are then etched at the same time. Thus, many trenches can be formed at one single step. This technique is much more efficient than the prior art method which has to make an initial damage to the object at the start of each cut.

Although an angle α of 90° may be useful in cutting semiconductor wafers, α can also be any other value so as to enable cutting of wafers in directions other than the crystal alignment. This can be applied to certain applications, such as wafer edge trimming.

Figure 6:
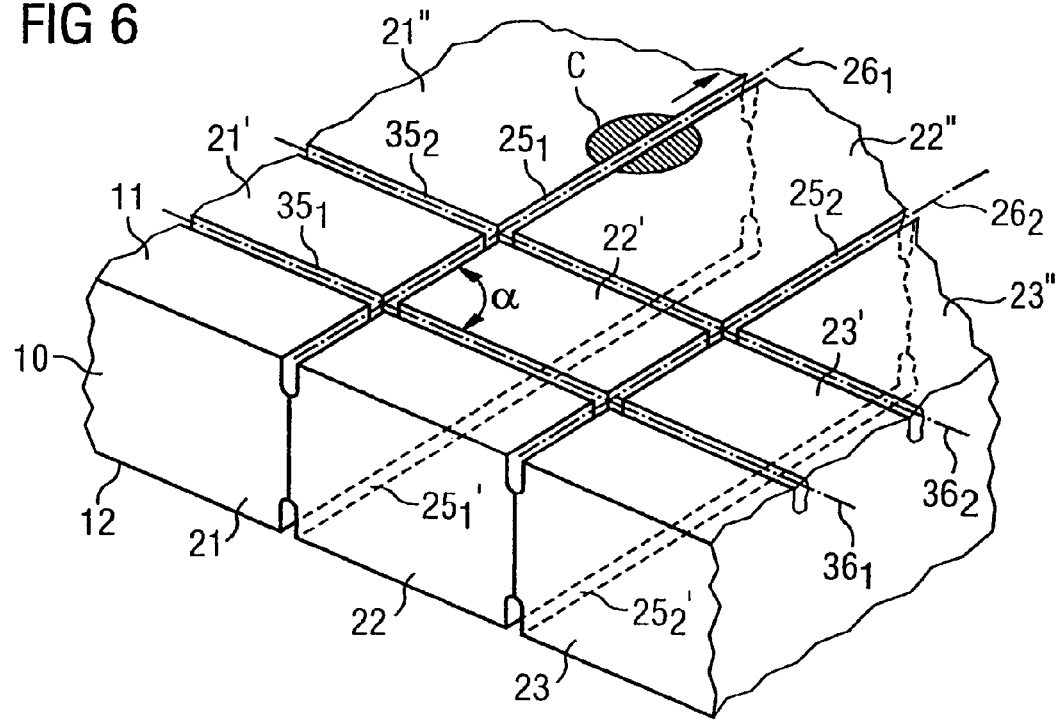
FIG. 6 is a perspective view of a part of the object being split using a fifth embodiment of the method of the present invention.

FIG. 6 is a perspective view illustrating a part of the object of brittle material being split under a fifth embodiment of the method of the present invention. This embodiment is the same as the fourth embodiment, except that, during the trench etching step, a third plurality of trenches $25'_1, 25'_2, \ldots, 25'_n$ (here only two are illustrated) are additionally etched in parallel in the other surface 12 of the object. The third plurality of trenches are etched in good alignment with the first plurality of trenches $25_1, 25_2, \ldots, 25_n$, respectively, in the opposite surface 11.

Figure 7:
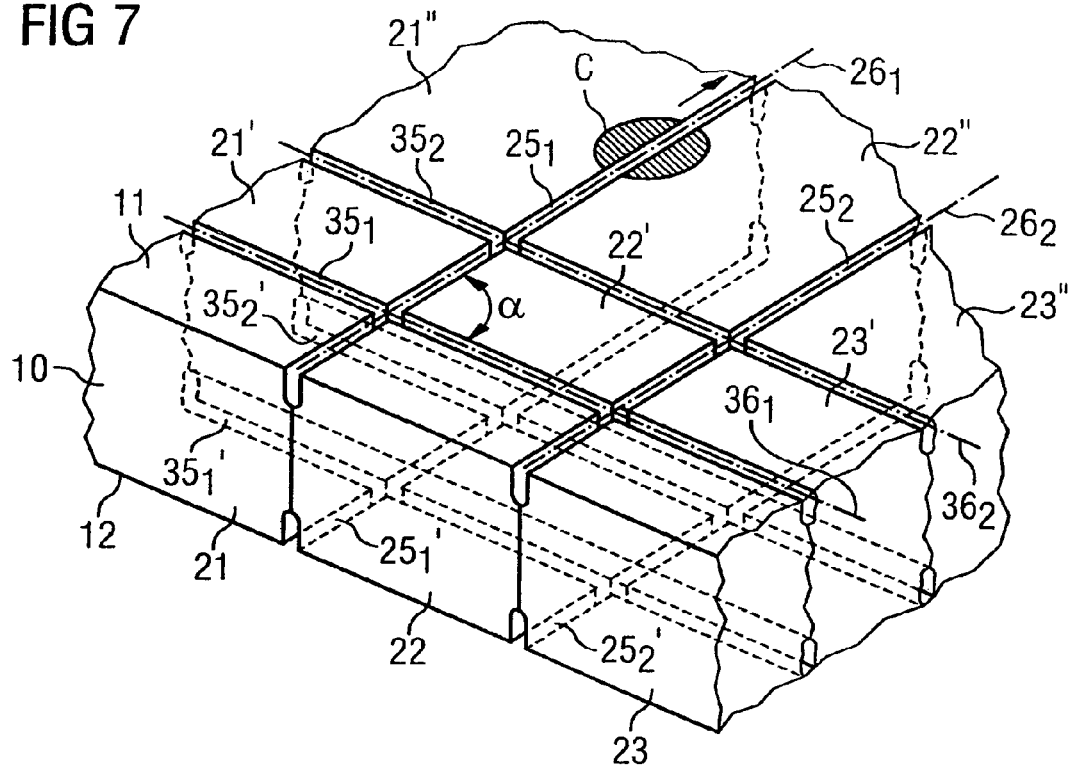
FIG. 7 is a perspective view of a part of the object being split using a sixth embodiment of the method of the present invention.

FIG. 7 is a perspective view illustrating a part of the object of brittle material being split under a sixth embodiment of the method of the present invention. This embodiment is the same as the fifth embodiment, except that, during the trench etching step, a fourth plurality of trenches $35'_1, 35'_2, \ldots, 35'_n$ (here only two are illustrated) are additionally etched in parallel in the same surface 12 as the third plurality of trenches $25'_1, 25'_2, \ldots, 25'_n$ (here only two are illustrated). This fourth plurality of trenches are etched in good alignment with the second plurality of trenches $35_1, 35_2, \ldots, 35_n$ (here only two are illustrated), respectively, in the opposite surface 11.

Figure 8:
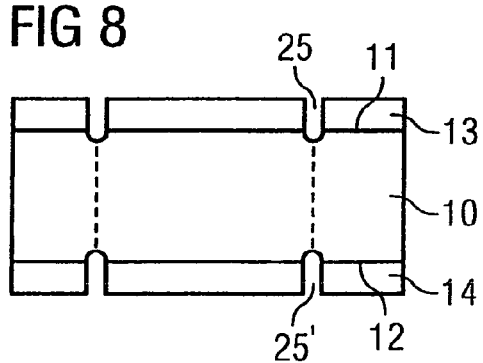
FIG. 8 is a cross sectional view of a part of the object being split using a sixth embodiment of the method of the present invention.

FIG. 8 is a cross sectional view illustrating an object of brittle material being split under a sixth embodiment of the method of the present invention. As mentioned earlier, an object of brittle material may be a processed semiconductor wafer 10 with a metallization or other layer(s) layer 13 or 14 formed either above the upper surface 11 or below the lower surface 12, or a wafer with two or more such metallization or other layer(s) 13 and 14, one 13 formed above the upper surface 11 of the wafer and the other 14 below the lower surface 12. For example in applying the method of the present invention to such a semiconductor wafer with additional metallization layer(s), the etching step will etch through the metallization layer(s) 13, 14 and further into the surface(s) immediately below and/or below the etched metallization layer(s).

Figure 9:
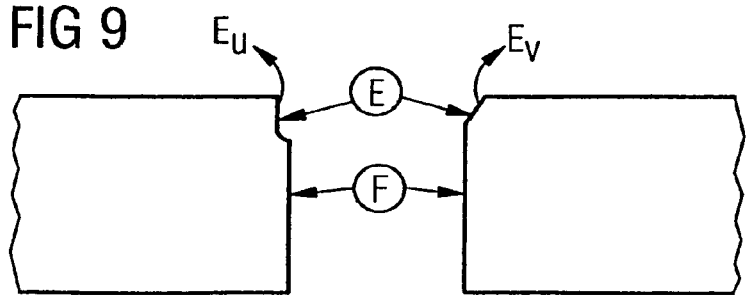
FIG. 9 is a cross sectional view of an example edge formed by the method of the present invention.

FIG. 9 is a cross sectional view of an example edge formed by the method of the present invention. In the figure, E is an etched part of the edge, formed by the etching step. In particular, the etched part on the left hand side is the result from a U-shaped trench, which may be formed by using a dry etchant of the anisotropic dry plasma type. The etched part on the right hand side is the result from a V-shaped trench, which may be formed by using an etchant such as a wet chemical. F is the part generated by the final splitting step using any of the conventional brittle material splitting methods. F is essentially a straight line.

The at least one line formed by etching may have the form of a closed loop (not depicted). This is in particular useful for wafer edge trimming. In this case the line returns to its starting point, and the wafer is then split along this line.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for splitting an object made of brittle material into at least two pieces, the object having a first flat surface and a second flat surface opposite to each other, the method comprising:
   etching at least one trench in at least one of the surfaces so as to form at least one line on the surface where at least some of the brittle material is removed, the trench etched to have a depth and a width such that the depth-to-width ratio is equal to or above 5 to 1; and
   splitting the object into separate pieces along the line.

2. The method of claim 1, wherein the line starts from one end of the surface to another end of the surface.

3. The method of claim 1, wherein the line forms a closed loop.

4. The method of claim 1, wherein the etching step etches a first plurality of trenches in parallel in the first surface of the object.

5. The method of claim 4, wherein the etching step further etches a second plurality of trenches in parallel in the first surface, the first and second plurality of trenches forming an angle α in between, the angle α being greater than 0°.

6. The method of claim 5, wherein the angle α is 90°.

7. The method of claim 5, wherein the etching step further etches a third plurality of trenches in parallel in the second surface of the object, wherein the first and third plurality of trenches are aligned.

8. The method of claim 7, wherein the etching step further etches a fourth plurality of trenches in parallel in the second surface, and wherein the second and fourth plurality of trenches are aligned.

9. The method of claim 1, wherein the object is a processed semiconductor wafer, the first and second surfaces are respectively the upper and lower surfaces of the wafer.

10. The method of claim 9, wherein at least one layer is formed on at least one of the first and second surfaces of the wafer and wherein the at least one trench is etched through the at least one layer.

11. The method of claim 10, wherein the at least one trench is etched through the layer and into the wafer.

12. The method of claim 10, wherein the at least one layer is a metallization layer.

13. The method of claim 10, wherein the at least one layer is a passivation layer.

14. The method of claim 10, wherein the at least one layer is a composite layer comprising at least one of the following layers: metallization layer, passivation layer, and isolation layer.

15. The method of claim 1, wherein the etching step uses a dry etch.

16. The method of claim 15, wherein the dry etch is of the anisotropic dry plasma type.

17. The method of claim 1, wherein the etching step uses a wet etch.

18. The method of claim 1, wherein the trenches are etched to result in a high depth-to-width ratio.

19. The method of claim 1, wherein the splitting step uses mechanic force to split the object into separate pieces.

20. The method of claim 1, wherein the splitting step uses an abrasion method to split the object into separate pieces.

21. The method of claim 1, wherein the splitting step uses a thermal splitting method to split the object into separate pieces.

22. The method of claim 1, wherein the brittle material is one of a glass comprising: glass, silicon, germanium, sapphire, quartz, ceramic and silicone carbide.

23. A method for splitting an object made of brittle material into at least two pieces, the object having a first flat surface and a second flat surface opposite to each other, the method comprising:
   etching at least one trench in at least one of the surfaces so as to form at least one line on the surface where at least some of the brittle material is removed, the trench etched to have a depth and a width such that the depth-to-width ratio is equal to or above 5 to 1; and
   using a thermal shock process to split the object into separate pieces along the line.

\* \* \* \* \*